United States Patent
Singer et al.

(10) Patent No.: US 10,217,731 B2
(45) Date of Patent: Feb. 26, 2019

(54) METHOD OF PRODUCING OPTOELECTRONIC MODULES AND AN ASSEMBLY HAVING A MODULE

(71) Applicant: OSRAM Opto Semiconductors GmbH, Regensburg (DE)

(72) Inventors: Frank Singer, Regenstauf (DE); Thomas Schwarz, Regensburg (DE); Stefan Grötsch, Bad Abbach (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/529,112

(22) PCT Filed: Nov. 30, 2015

(86) PCT No.: PCT/EP2015/078042
§ 371 (c)(1),
(2) Date: May 24, 2017

(87) PCT Pub. No.: WO2016/087360
PCT Pub. Date: Jun. 9, 2016

(65) Prior Publication Data
US 2017/0294428 A1   Oct. 12, 2017

(30) Foreign Application Priority Data

Dec. 4, 2014   (DE) .......................... 10 2014 117 897

(51) Int. Cl.
*H01L 25/16*   (2006.01)
*H01L 23/00*   (2006.01)
(Continued)

(52) U.S. Cl.
CPC ............ *H01L 25/167* (2013.01); *H01L 24/97* (2013.01); *H01L 25/0753* (2013.01);
(Continued)

(58) Field of Classification Search
CPC ... H01L 25/0753; H01L 25/167; H01L 33/52; H01L 33/62; H01L 33/642
(Continued)

(56) References Cited

U.S. PATENT DOCUMENTS

2003/0143406 A1   7/2003   Siegel et al.
2005/0012457 A1   1/2005   Wu
(Continued)

FOREIGN PATENT DOCUMENTS

| DE | 10 2006 031 679 A1 | 1/2008 |
| DE | 10 2013 203 350 A1 | 8/2014 |
| EP | 1 085 566 A1 | 3/2001 |

OTHER PUBLICATIONS

Machine Translation of DE 102013203350 A1.*
(Continued)

*Primary Examiner* — Marvin Payen
(74) *Attorney, Agent, or Firm* — DLA Piper LLP (US)

(57) ABSTRACT

A method produces a plurality of optoelectronic modules, and includes: A) providing a metallic carrier assembly with a plurality of carrier units; B) applying a logic chip, each having at least one integrated circuit, to the carrier units; C) applying emitter regions that generate radiation, which can be individually electrically controlled; D) covering the emitter regions and the logic chips with a protective material; E) overmolding the emitter regions and the logic chips so that a cast body is formed, which joins the carrier units, the logic chips and the emitter regions to one another; F) removing the protective material and applying electrical conductor paths to the upper sides of the logic chips and to a cast body upper side; and G) dividing the carrier assembly into the modules.

16 Claims, 8 Drawing Sheets

(51) Int. Cl.
   *H01L 25/075*   (2006.01)
   *H01L 33/52*   (2010.01)
   *H01L 33/62*   (2010.01)
   *H01L 33/64*   (2010.01)

(52) U.S. Cl.
   CPC .............. *H01L 33/52* (2013.01); *H01L 33/62* (2013.01); *H01L 33/642* (2013.01); *H01L 2933/005* (2013.01); *H01L 2933/0066* (2013.01)

(58) Field of Classification Search
   USPC .................................. 257/99–103; 438/79–98
   See application file for complete search history.

(56) References Cited

U.S. PATENT DOCUMENTS

| | | | |
|---|---|---|---|
| 2007/0262346 A1 | 11/2007 | Otremba et al. | |
| 2009/0230523 A1 | 9/2009 | Chien et al. | |
| 2012/0146203 A1* | 6/2012 | Camacho | H01L 21/4832 257/676 |

OTHER PUBLICATIONS

"Details of the Assembly and Solder Pad Design of the OSLON, OSLON SSL and OSLON Square Family," OSRAM Opto Semiconductors Datasheet, Feb. 2012, 10 pages.
"OSRAM OSTAR Headlamp & Headlamp Pro—Details on Handling, Mounting and Electrical Connection," OSRAM Opto Semiconductors Datasheet, Oct. 2012, 11 pages.
Michael Bender, "Melexis unveils first monolithic slave IC for LIN-based RGB LED control-enabling cost effective automotive ambient lighting," Melexis, Nov. 13, 2012.
Wolfgang Peinhopf, "Chip-Embedded Packaging Contributes to New Performance Benchmark for DrMOS," Infineon Technologies AG, power electronics, Mar. 28, 2013, 4 pages.
"PLCC 5050 1W HR Datasheet," Edison, 2014, 12 pages.
"WS2812 Intelligent control LED integrated light source," Worldsemi Datasheet, 2014, 5 pages.
Infineon: "Infineon Introduces DrBlade, the new Generation DrMOS in Innovative Chip-Embedded Packaging Technology," Apr. 12, 2013, www.radiolocman.com/news/new.html?di=148155, 2 pages.
Zhang, A., "aQFN," Oct. 12, 2010, ww.indium.com/blog/aqfn.php, 3 pages.

* cited by examiner

A)

B)

C)

D)

A)

B)

A)

B)

A)

B)

A)

B)

A)

B)

A)

B)

METHOD OF PRODUCING OPTOELECTRONIC MODULES AND AN ASSEMBLY HAVING A MODULE

TECHNICAL FIELD

This disclosure relates to a method of producing optoelectronic modules and an assembly comprising such a module.

BACKGROUND

There is a need to provide an optoelectronic module having a high surface density of individually-addressable emitter regions.

SUMMARY

We provide a method of producing a plurality of optoelectronic modules including: A) providing a metal carrier composite having a plurality of carrier units, B) applying at least one logic chip each having at least one integrated circuit to the carrier units, C) applying a plurality of light-emitting diode chips including in each case multiple emitter regions individually electrically-controllable, which are based on a semiconductor material and configured to generate radiation and can be controlled individually, to the logic chips attached to the carrier units, D) covering the emitter regions and the logic chips with a protective material so that upper sides of at least one of the emitter regions and the logic chips facing away from the carrier units are covered by the protective material, E) molding around the emitter regions and the logic chips so that a cast body is produced, which connects at least the carrier units and the logic chips with one another, F) removing the protective material and applying electrical conductor paths at least to the upper sides of the logic chips and to a cast body upper side of the cast body facing away from the carrier units, and severing the carrier assembly into the modules, wherein the carrier units as a whole or at least carrier isles on which the emitter regions and the logic chip are located do not have any electrical function in the finished module, and electrically controlling the emitter regions is effected exclusively via the logic chip of the respective module.

We also provide an assembly including at least one optoelectronic module produced by the method of producing a plurality of optoelectronic modules including: A) providing a metal carrier composite having a plurality of carrier units, B) applying at least one logic chip each having at least one integrated circuit to the carrier units, C) applying a plurality of light-emitting diode chips including in each case multiple emitter regions individually electrically-controllable, which are based on a semiconductor material and configured to generate radiation and can be controlled individually, to the logic chips attached to the carrier units, D) covering the emitter regions and the logic chips with a protective material so that upper sides of at least one of the emitter regions and the logic chips facing away from the carrier units are covered by the protective material, E) molding around the emitter regions and the logic chips so that a cast body is produced, which connects at least the carrier units and the logic chips with one another, F) removing the protective material and applying electrical conductor paths at least to the upper sides of the logic chips and to a cast body upper side of the cast body facing away from the carrier units, and severing the carrier assembly into the modules, wherein the carrier units as a whole or at least carrier isles on which the emitter regions and the logic chip are located do not have any electrical function in the finished module, and electrically controlling the emitter regions is effected exclusively via the logic chip of the respective module, and at least one circuit board directly connected to electric contact points of the module.

We further provide a method of producing a plurality of optoelectronic modules including: A) providing a metal carrier composite having a plurality of carrier units, B) applying at least one logic chip each having at least one integrated circuit to the carrier units, C) applying multiple emitter regions based on a semiconductor material and configured to generate radiation and can be controlled individually, to the carrier units or to the logic chips attached to the carrier unit, D) covering the emitter regions and the logic chips with a protective material so that upper sides of the emitter regions and/or of the logic chips facing away from the carrier units are covered by the protective material, E) molding around the emitter regions and the logic chips so that a cast body is produced, which connects at least the carrier units and the logic chips with one another, F) removing the protective material and applying electrical conductor paths at least to the upper sides of the logic chips and a cast body upper side of the cast body facing away from the carrier units, and G) severing the carrier assembly into the modules.

Figure 1:
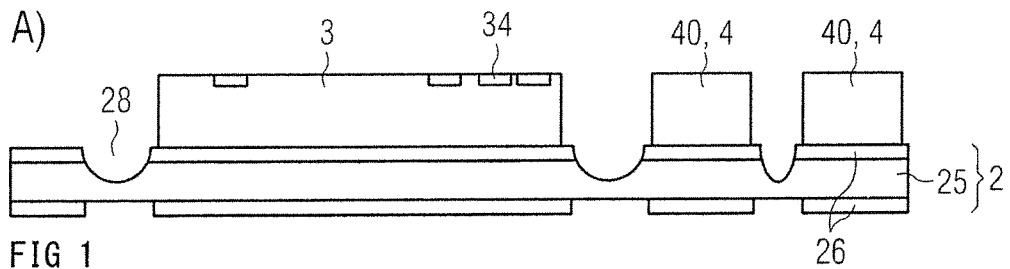
FIGS. 1A-1D and 5A-5B show schematic illustrations of methods described herein to produce optoelectronic modules described herein.
Figure 1:
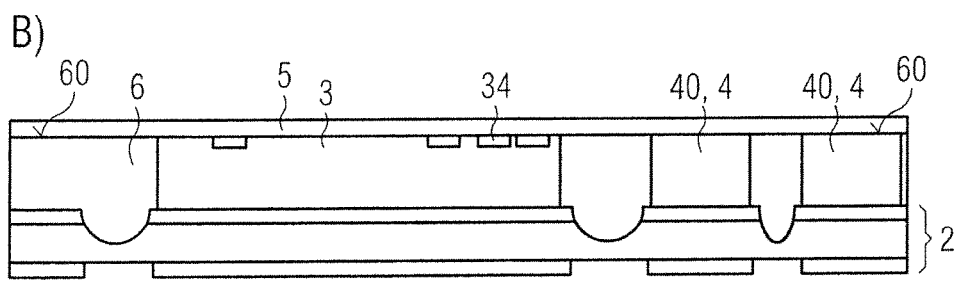
Figure 1:
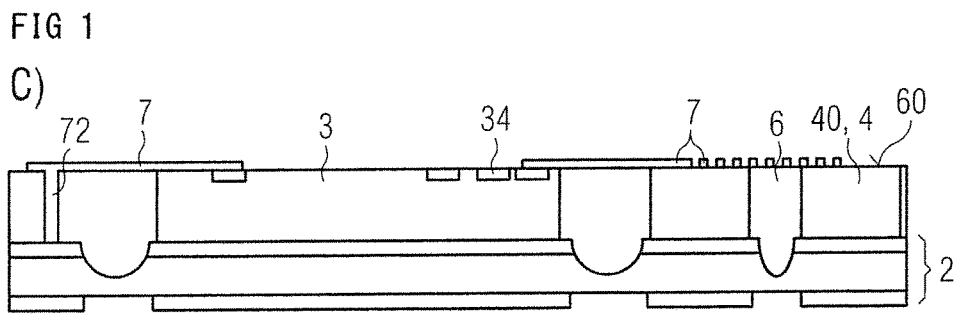
Figure 1:
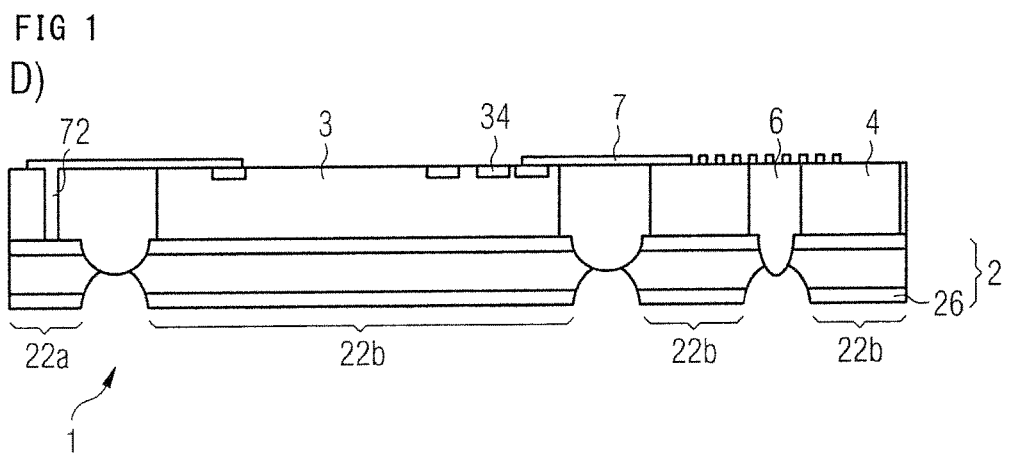

LIST OF REFERENCE NUMERALS 1 optoelectronic module
20 carrier composite
2 carrier unit
22 carrier isle
23 connecting element
25 core material
26 coating
28 depression
3 logic chip
34 electrical contact structure
4 emitter region
40 light-emitting diode chip
5 protective material
6 cast body
60 cast body upper side
7 electric conductor path
72 electric through-connection
8 electric contact point
9 circuit board
91 metal core
92 insulation layer
94 penetration
95 electronic component
19 cooling body 10 assembly
R radiation
S separation region

DETAILED DESCRIPTION

We provide a method of producing a plurality of optoelectronic modules. In particular, the modules are configured to emit electromagnetic radiation, specifically visible light. For example, the module serves as a lighting device in general lighting systems or in the automotive sector, e.g., as an adaptive head lamp in a motor vehicle.

A metal carrier composite is provided. The term "metal" means that the carrier composite comprises or consists of one or multiple alloys. The carrier composite is a sheet metal that may comprise metal coatings on main sides, for example.

The carrier composite may comprise a plurality of carrier units. It is possible for the carrier composite to be structured physically into the carrier units not before performing the method. In other words, the initially-provided carrier composite may be an element that is yet unstructured and divided into the carrier units merely virtually.

In each case, one or multiple logic chips may be applied to each one of the carrier units. Preferably, the logic chip comprises one or multiple integrated circuits. The logic chip may be a drive chip, an address chip and/or a memory chip. In particular, the logic chip is bonded or soldered on the assigned carrier unit.

Multiple emitter regions may each be applied to the carrier units. Preferably, the emitter regions are based on a semiconductor material such as AlInGaN or AlInGaP or AlInGaAs. In particular, the emitter regions are regions of a light-emitting diode. The emitter regions are configured to generate radiation, in particular generation of visible light such as colored light, for example, blue light or mixed-colored light such as white light. It is possible for the logic chips and the emitter regions to be applied to the carrier units in a single method step. As an alternative, the logic chips can also be mounted prior to the emitter regions, or vice versa.

The emitter regions or groups of emitter regions can each be individually electrically-controlled. In other words, the emitter regions can be image points, also referred to as pixels.

The emitter regions and/or the logic chips may partially or preferably be completely covered with a protective material. The protective material can be a film applied over the entire carrier composite in a contiguous manner. Alternatively, sacrificial layers such as photoresists may serve as a protective material, for example. Corresponding sacrificial layers may be local and be limited only to the emitter regions and the logic chips in a targeted manner. The protective material can directly be applied to the emitter regions and/or the logic chips.

The at least one protective material may only be applied to the upper sides of the emitter regions and/or the logic chips, with the upper sides facing away from the sides of the carrier. In particular, side surfaces of the emitter regions and/or of the logic chips as well as regions of the carrier units uncovered by the emitter regions and the logic chips remain free from the protective material.

Coating and/or molding around the emitter regions and/or the logic chips may be effected. A cast body is produced by this molding-around. A material of the cast body is a thermoplastic resin or as well an epoxy or a silicone.

The carrier units, the emitter regions and the logic chips may connect to one another by the cast body. In other words, the carrier unit, the emitter regions and the logic chips are mechanically coupled to one another in a firm manner so that the components do not detach from one another during the intended use of the finished module. The cast body may as well be the main component or one of the main components, which are supported mechanically and carried by module.

The protective material may be partially or completely removed. Thus, the protective material is preferably no longer present in the finished modules. Further preferred, the upper sides of the emitter regions and the logic chips are exposed during removal of the protective material, in particular completely exposed.

Electrical conductor paths may be formed on the upper sides of the emitter regions and of the logic chips as well as on a cast body upper side of the of the cast body facing away from the carrier units. These conductor paths are generated by vapor deposition or galvanization or by photolithography, for example. Preferably, the conductor paths are metal conductor paths. In particular, an electric connection between the logic chip and electric contact points is established via the conductor paths for external electrical contacting of the module.

The carrier composite, in particular including the cast body, may be severed into the individual modules. Severing preferably includes a sawing process.

The method may be configured to produce a plurality of optoelectronic modules and comprises the following steps preferably in the indicated order:

A) providing a metal carrier composite having a plurality of carrier units,
B) applying in each case at least one logic chip each having at least one integrated circuit to the carrier units,
C) applying in each case multiple emitter regions based on semiconductor material and configured to generate radiation and can be controlled individually, to the carrier units or to the logic chips applied to the carrier units,
D) covering the emitter regions and the logic chips with a protective material so that upper sides of the emitter regions and/or of the logic chips facing away from the carrier units are partially or completely covered by the protective material,
E) molding around the emitter regions and/or the logic chips such that a cast body is produced, which mechanically connects the carrier units, the emitter regions and the logic chips with one another,
F) removing the protective material and applying electrical conductor paths to a cast body upper side of the cast body facing away from the carrier units as well as to the upper sides of at least the logic chips and optionally also the emitter regions, and
G) severing the carrier assembly into the modules.

By the method described herein, highly-compact modules with integrated CMOS-ICs and individually-addressable emitter regions, monochrome or as well RGB, in particular for light-emitting diode pixels, e.g., for adaptive headlamps, for example, can be manufactured. The logic chips control the emitter regions and optionally assume further functions, e.g., as a data bus unit, current driver or as a memory.

The carrier composite may be contiguous, integral and free of recesses at least in the method steps A) to F). In other words, in a plan view of the carrier composite, this carrier composite is free of gaps in the mentioned method steps. This does not preclude the carrier composite from comprising regions of reduced thickness, wherein the thickness is in each case greater than zero, also in these regions.

The carrier units may be a heat sink in the finished modules. In other words, the carrier units are then configured for heat dissipation and/or heat expansion. To that end, a main material of the carrier units is preferably a thermally well-conducting metal or a metal alloy, preferably including copper or aluminum.

The finished products may be surface-mounted devices, so-called SMDs. In other words, the finished modules can then be contacted, preferably electrically and/or mechanically, exclusively on a single main side. In particular, electric contact points for externally electrically contacting the module may be exclusively produced on the cast body upper side. As an alternative, electric contact points for the external electrical contacting can, in particular exclusively, be present on a lower side of the carrier. The lower side of the carrier is facing away from the cast body.

Method step G) may comprise the sub-step of patterning the carrier units from lower sides of the carrier facing away from the logic chip by a material-removing method. Preferably, the material-removing method is an etching method or a laser treatment. When patterning from the lower sides of the carrier, it is possible for the carrier units to be penetrated in places so that a material of the carrier units is in places completely removed in a top view.

Method step G) may comprise severing the cast body. Preferably, this method step is effected after patterning the carrier units. Furthermore, severing the cast body is preferably effected in separation regions between neighboring carrier units. The separation regions can be free or essentially free of a material of the carrier composite and/or of the carrier units. As a result, a high sawing speed can be achieved in a sawing process since no or no significant amount of metal has to be cut-through.

The carrier units may be structured such that in method step G) the emitter regions and the logic chips are each unambiguously attached to one carrier isle in the finished module. In other words, each logic chip and each emitter region is assigned exactly one carrier isle. The carrier isles are formed of a material of the carrier units with the carrier regions each comprising a plurality of the carrier isles. The carrier isles, which are preferably all located in a common plane, are spaced from one another, in particular in a top view.

The carrier units may or may not have any electrical function in the finished module. Thus, the carrier units can exclusively be configured for heat dissipation and/or mechanical contacting of the module.

With the carrier units being sub-divided into carrier isles, all carrier isles, or at least the carrier isles having emitter regions and the logic chips located thereon, may or may not have any electric function. A heat sink and mechanical contactability can be ensured by these non-electrically functionalized emitter regions.

The carrier isles and/or the contiguous carrier unit, which is not sub-divided into isles, may or may not have an electric function. For example, the carrier unit and/or the carrier isles are configured to be placed to a common electric potential, e.g., also referred to as a common ground.

Electrical control of the emitter regions may be effected exclusively via the logic chip of the corresponding module. This may mean that a current supply of the assigned emitter regions is regulated by the logic chip. An anode contact or a cathode contact of the emitter regions is controlled by the logic chip, for example.

Prior to step E), the carrier composite and/or the carrier units may be patterned, in particular etched, from a first main side. In this first patterning process, the carrier composite and/or the carrier units are preferably not completely penetrated so that the carrier composite is maintained as a contiguous layer free of holes. This patterning process is preferably effected from the main side having the logic chips and the emitter regions applied thereon, or later having the logic chips and emitter regions applied thereon.

Patterning of the carrier composite and/or of the carrier units may be effected from a second main surface that preferably is the lower side of the carrier facing away from the logic chips. In this second pattering step, holes, recesses and/or discontinuities can be formed in the carrier composite and/or in the carrier units.

The patterning steps may be effected by an etching process. As an alternative, sawing or laser patterning is also possible.

The emitter regions may be arranged exclusively on an upper side of the corresponding laser logic chip facing away from the assigned carrier unit. In other words, the emitter regions do not protrude from the logic chip when viewed from a top. In this arrangement, it is possible for the emitter regions to not be in direct contact to the cast body.

The upper sides of the logic chips may be provided with an electrical contact structure. In particular, the electrical contact structure comprises a plurality of electric contacts. It is possible that in each case one or two or more than two electric contacts are present on the upper side per emitter region. In a top view, the respective electrical contacts are preferably completely covered by the assigned emitter regions. In terms of the electrical function, an unambiguous assignment can be provided between the emitter regions and the electrical contacts.

Light-emitting diode chips may be present. The light-emitting diode chips comprise all or at least several of the emitter regions. Incidentally, the light-emitting diode chips preferably constitute a mechanically-manageable unit. The light-emitting diode chips are manageable as a whole in a pick-and-place process, for example. The light-emitting diode chips are preferably optically and electrically sub-divided into the individual emitter regions.

A die cast body upper side may terminate flush with the upper sides of the logic hips and/or of the emitter regions in a direction away from the carrier units. As an alternative, it is possible for the emitter regions and/or the logic chips to protrude from the cast body upper side in the direction away from the carrier units.

The emitter regions may have an average lateral extension of at least 2 µm or 5 µm or 10 µm in the direction parallel to the cast body upper side. As an alternative or in addition, this average lateral extension is no more than 250 µm or 50 µm or 20 µm.

The finished modules may each comprise at least 16 or 64 or 256 individually controllable emitter regions. Alternatively, or in addition, the number of emitter regions per module is $10^6$ or $10^4$ or $10^3$ at the most. Preferably, in a top view, at least 2×2 or 4×4 emitter regions are present.

The emitter regions may be configured for generation of blue light. It is possible for a phosphor for the partial or complete conversion of blue light to be arranged downstream of the emitter regions so that in particular white light is generated. All emitter regions can be designed in the same way according to manufacturing tolerances and can be configured to emit radiation in the same spectral range. As an alternative, it is possible that emitter regions emitting different colors are present, in particular emitter regions emitting red light, emitter regions emitting blue light, and emitter regions emitting green light. If all emitter regions emit light of the same color, e.g., blue light or ultraviolet light, the emitter regions can be assigned different phosphors, in particular to generate blue, green and/or red light. A RGB module can be produced with emitter regions that emit different colors.

Furthermore, an assembly is provided. The assembly comprises one or multiple of the optoelectronic modules produced by a method according to one or multiple of the examples mentioned above. Thus, features disclosed for the assembly are also disclosed for the optoelectronic module as well as for the method and vice versa.

The assembly may comprise one or multiple of the optoelectronic modules. The assembly may further comprise one or multiple circuit boards. The circuit boards are metal core boards or printed circuit boards, PCBs for short. It is possible for the circuit boards to be a flexible circuit board. Further logic chips that do not form part of the module can be attached to the circuit board or be connected to the module via the circuit board.

The at least one circuit board directly or indirectly connects to the electric contact points of the module. The circuit board preferably contacts only exactly one main side of the optoelectronic module. Direct electric connection can mean that only an electrical connecting element such as a solder or an electrically-conductive adhesive is present between the circuit board and the electrical contact point of the module.

The circuit board may comprise a penetration. In other words, the circuit board is provided with a hole such that the hole is enclosed by a material of the circuit board in a top view. The penetration preferably has smaller dimensions than the assigned module in a top view. The module is configured to emit radiation through the penetration.

The circuit board may be applied exclusively to an upper side of the module facing away from the carrier unit. As an alternative, it is possible that, in addition to this circuit board applied to the upper side, an additional heat sink is mounted the opposite main side.

The circuit board and the module may be arranged next to one another on a heat sink, in a top view.

A method described herein and an assembly described herein are explained in more detail with reference to the drawings by examples. Like reference numerals refer to like elements throughout the individual figures. However, no true-to-scale references are illustrated, and individual elements can rather be illustrated in an exaggerated size for a better understanding.

FIG. 1 shows a method of producing optoelectronic modules 1 in schematic sectional views. According to FIG. 1A, a carrier composite having carrier units 2 is provided. For the purpose of a better illustration, only a single carrier unit 2 of the carrier composite is illustrated in FIG. 1. The carrier unit 2 is provided for a single module 1.

The carrier unit 2 as well as the carrier composite, not illustrated in further detail here, are formed of a metal sheet. The carrier unit 2 and thus the carrier composite comprise a core material 25, which is a metal. The core material 25 is copper or aluminum, for example. The core material 25 is provided with a coating 26 on both sides, made of NiAu, for example. The coating 26 may be composed of multiple sub-layers, preferably all metal layers.

A logic chip 3, e.g., a CMOS-IC, is applied to the carrier unit 2, in particular by soldering or bonding. Furthermore, multiple light-emitting diode chips 40 are attached. Each of the light-emitting diode chips 40 is provided to generate radiation such as blue light, for example. The light-emitting diode chips 40 emit radiation over an entire or almost entire upper side facing away from the carrier unit 2. The light-emitting diode chips 40 each also represent an emitter region 4. For the purpose of an easier illustration, the module 1, as illustrated in FIG. 1, only comprises two of the light-emitting diode chips 40. Preferably, significantly more than two light-emitting diode chips 40 and emitter regions 4 are present. It is possible for the light-emitting diode chips 40 to be arranged around the logic chips 3 in a top view.

In a departure from the structure shown in FIG. 1, it is possible for the module 1 to comprise multiple, different logic chips 3. Also, further semiconductor chips (not shown) not emitting radiation, e.g., protective diodes against damage of electrostatic discharge, can be provided.

The coating 26 is patterned photolithographically, and after that depressions 28 are formed in the carrier unit 2 by etching, for example. At this method stage, the depressions 28 are formed merely from one main side so that the core material 25 on the opposite main side is not or essentially not removed.

FIG. 1B shows that a temporary protective material 5 is applied over the light-emitting diode chips 40 as well as the logic chip 3. The protective material 5 is a contiguous film, for example. Subsequently, a cast body 6 is produced. Due to the protective material 5, upper sides of the logic chip 3 as well as of the light-emitting diode chips 40 facing away from the carrier unit 2 remain free of a material of the cast body 6. This way of producing the cast body 6 is also referred to as film-assisted molding. The carrier unit 2, the light-emitting diode chips 40 and the logic chip 3 are directly and mechanically connected with one another in a firm manner by the cast body 6, which comprises a cast body upper side 60 facing away from the carrier unit 2.

The cast body 6 completely fills the depressions 28 and thereby engages in the depressions 28. In contrast to FIG. 1B, a sacrificial layer can also be used for the protective material 5 instead of a film. Such a sacrificial layer is formed of a photoresist, for example, which is applied to the upper sides of the light-emitting diode chips 40 as well as of the logic chip 3.

According to FIG. 1C, the protective layer 5 is completely removed again so that the upper sides of the light-emitting diode chips 40 as well as of the logic chip 3 are exposed. The electrical contact structures 34 on the upper side of the logic chips 3 are also exposed thereby. Respective contact structures (not shown) are present on the upper sides of the light-emitting diode chips 40.

Hereinafter, electric conductor paths 7 are produced on the cast body upper side 60, on the upper sides of the light-emitting diode chips 40 as well as the logic chip 3. Via these conductor paths, 7 electrical wiring is achieved between the light-emitting diode chip 40 and the logic chip 3. Thus, the light-emitting diode chips 40 can be operated and controlled individually and electrically independently from one another by the logic chip 3.

Furthermore, an electric through-connection 72 is produced through the cast body 6 towards the carrier unit 2. The carrier isles 22b, on which the light-emitting diode chips 40 as well as the logic chips 3 are attached, do not have any electric function and are merely configured to mechanically fix the module 1 and for heat dissipation. As an alternative, carrier isles 22b can be configured as a common ground, or as another electrical contact, in particular on the same electric potential.

The carrier isle 22a on which the through-connection 72 is located, is configured for electrical contacting the module 1. Merely one such carrier isle 22a having one through-connection 72 is shown in the sectional illustration in FIG. 1D. Preferably, multiple such carrier isles are present.

FIG. 1D shows that another etching step is performed from a lower side of the carrier facing away from the light-emitting diode chip 40 as well as from the logic chip 3. In the regions of the carrier lower side not covered by the coating 26, the core material 25 is removed so that the cast body 6 is exposed on the lower side in places. Multiple carrier isles 22*a* are produced thereby, which are spaced from one another and are not directly electrically connected with one another.

Figure 2:
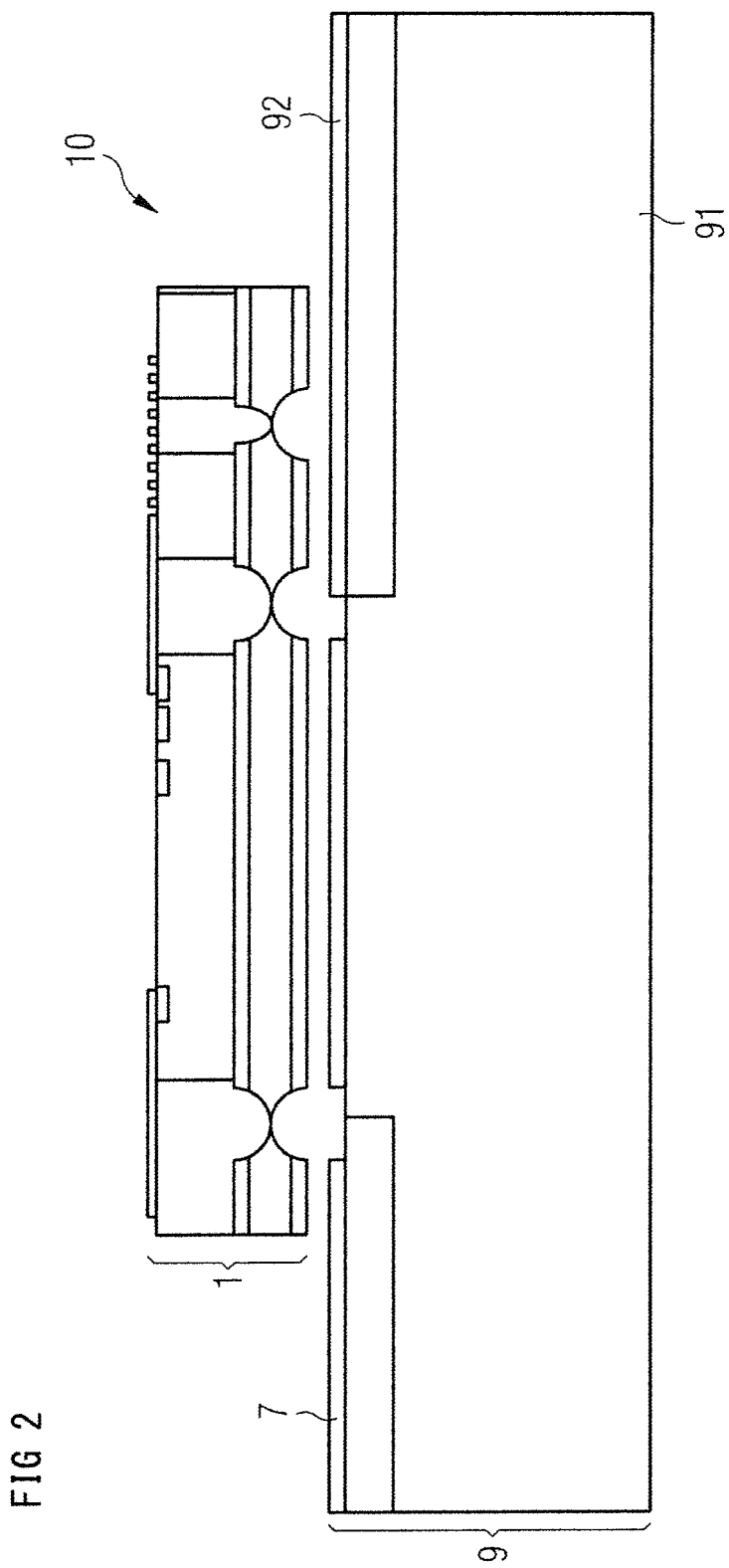
FIGS. 2, 7A-7B and 8A-8B show schematic illustrations of assemblies described herein having optoelectronic modules which are produced by methods described herein.

FIG. 2 shows an assembly 10 in a sectional view. The assembly 10 comprises an optoelectronic module 1, as explained in conjunction with FIG. 1, for example. The module 1 is applied to a circuit board 9. The circuit board 9 includes a metal core 91, which can be exposed in places on a side facing the module 1. Conductor paths 7 are present on the circuit board 9 for electrical, mechanical and thermal contacting of the module 1 on the circuit board 9. Optionally, an electrically-insulating layer 92 can be located between the metal core 91 and the conductor paths 7. No connecting element such as a solder between the circuit board 9 and the module 1, is illustrated in FIG. 2. Either only isles of the carrier unit having through-connections or in addition isles having the light-emitting diode chips and/or having the logic chip can be controlled via the conductor paths 7. The isles having the light-emitting diode chips and/or having the logic chip can be applied to a common ground potential here via these conductor paths 7.

The logic chips 3 as well as the emitter regions 4 can be contacted without bonding wires. In effect, the module 1 can be free of bonding wires so that a particularly compact, flat and cost-effective production is made possible.

The top view according to FIG. 3A as well as the sectional view according to FIG. 3B illustrate a further example of the optoelectronic module 1. In this module 1, the carrier unit 2, which is structured into multiple carrier isles 22, merely serves for mechanical fixing and heat dissipation of the module 1. Electrical contact points 8 for external electrical contacting of the module 1 are attached to the upper side facing away from the carrier unit 2 of the logic chip 3. As an alternative, the contact points 8 may also be located laterally next to the logic chip 3 in a top view and can be connected to the logic chip 3 via conductor paths on the carrier upper side 60.

Figure 3:
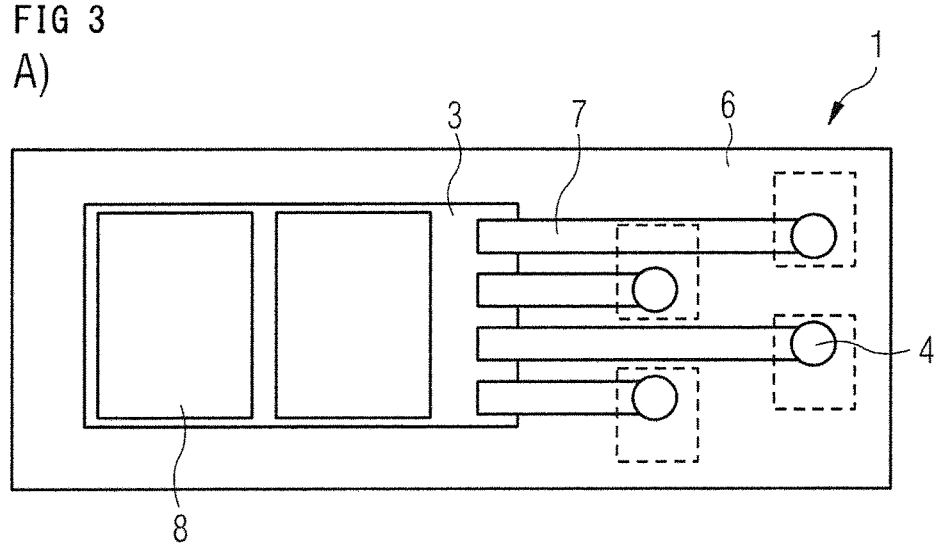
FIGS. 3A-3B, 4A-4B and 6A-6B show schematic illustrations of optoelectronic modules described herein produced by methods described herein.
Figure 3:
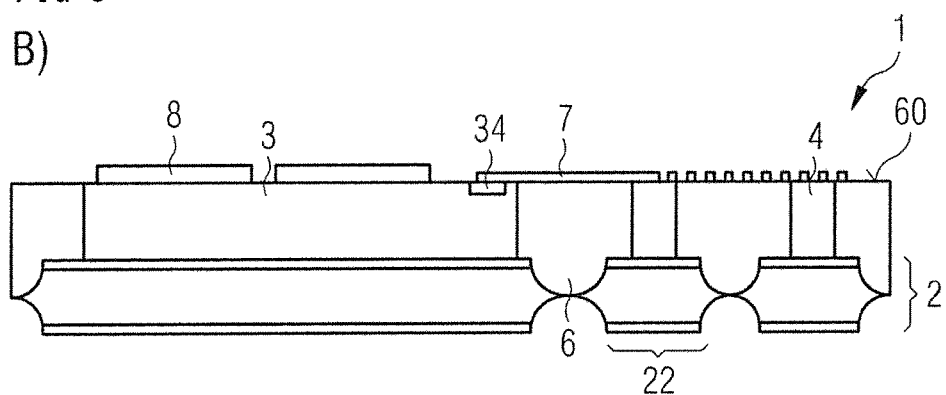

For the rest, the example according to FIG. 3 corresponds to the module 1, as illustrated in conjunction with FIG. 1. Thus, according to FIGS. 3A and 3B, no carrier isle connected to the logic chip 3 by a through-connection is present.

Figure 4:
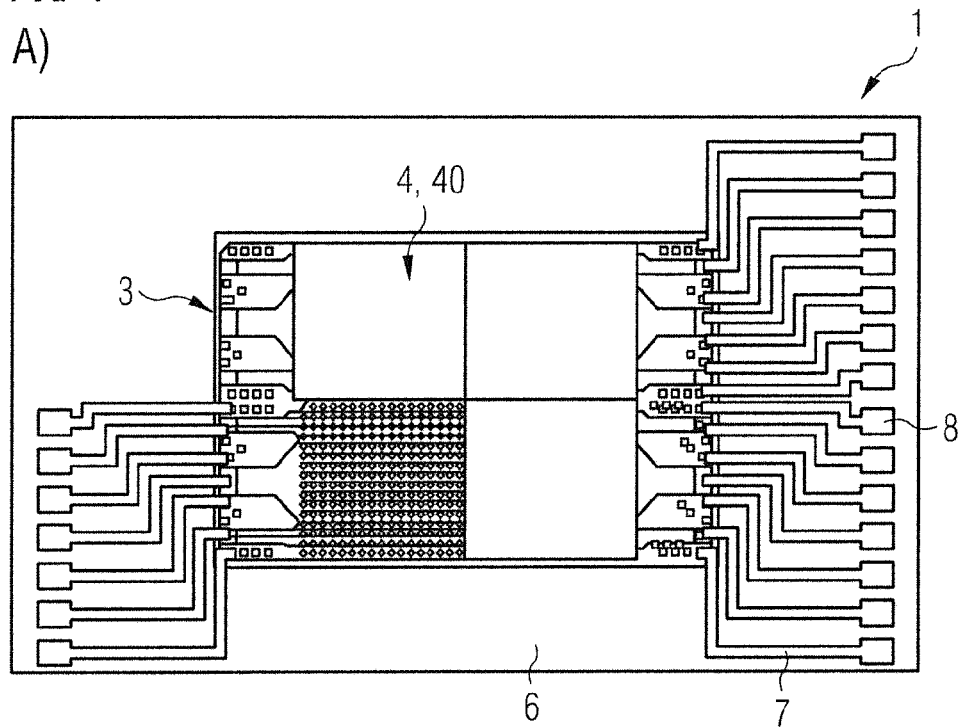
Figure 4:
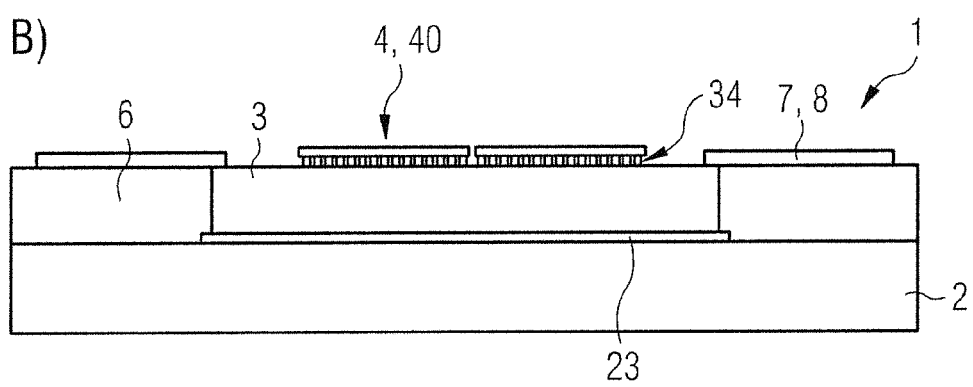

FIG. 4 illustrates another example of the module 1 (see top view in FIG. 4A and sectional view in FIG. 4B). The carrier unit 2 is formed integrally and is not structured into carrier isles. Main sides of the carrier unit 2 are formed planar and orientated in parallel to one another. For the purpose of a better illustration, optionally present coatings of the carrier unit 2 are not illustrated.

The logic chip 3 is fixed to the carrier unit 2 by a connecting element 23, e.g., a sintered or soldered intermediate connection. This fixing is effected via a CuSn solder and/or via a diffusion soldering, for example. The carrier unit 2 is a substrate which includes or is made from Cu, MoCu, and/or WCu.

A plurality of electrical contact structures 34 is provided on the upper side of the logic chip 3. Multiple light-emitting diode chips 40 are attached to these contact structures 34. The light-emitting diode chips 40 are sub-divided into a plurality of individually-controllable emitter regions 4, with the light-emitting diode chips 40 preferably being mechanically manageable as a single unit.

In FIG. 4A, the emitter regions 4 are symbolized by way of gridlines. In a top view, the emitter regions 4 are congruent with the assigned contact structures 34. In particular, each of the emitter regions 4 is assigned one or two of the contact structures 34. If the emitter regions 4 is assigned in each case only one contact structure 34, the light-emitting diode chips 40 may then dispose a common cathode.

In this assembly, the light-emitting diode chips 4 and thus the emitter regions 4 are spaced from the cast body 6. In the direction away from the carrier unit 2, contact structures 34 as well as the light-emitting diode chips 4 project from the cast body 6. Production of the module 1, as shown in FIG. 4, preferably ensues analogously to the method as explained in FIG. 1.

Peripheral electric contact points 8 connect to the logic chip 3 via the conductor paths 7. Preferably, no direct electric connection is provided between the individual emitter regions 4 and the contact points 8, except for a possibly provided common electrode, e.g., a common cathode.

The carrier unit 2 as shown in FIG. 4 is preferably mechanically rigid. A mechanically-stable module is achieved thereby.

Figure 5:
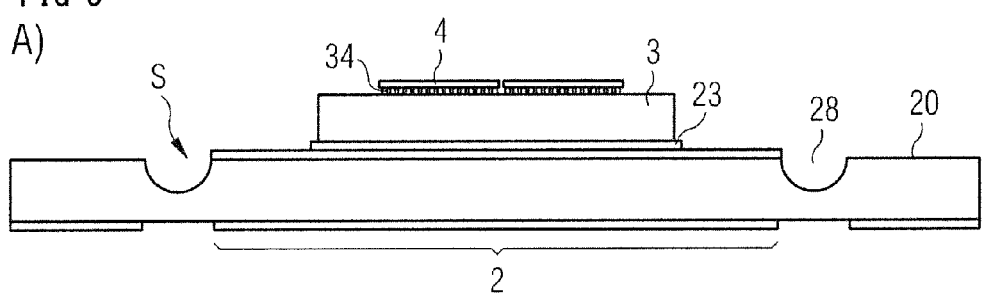
Figure 5:
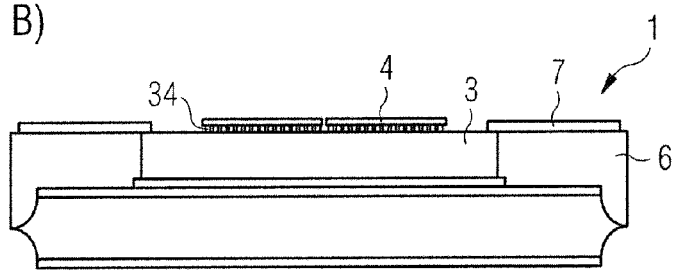

The sectional views of FIG. 5 show a production method for such a module 1, as illustrated in FIG. 4. The method step according to FIG. 5A is preferably effected analogously to FIG. 1A. The cast body 6 as well as the conductor paths 7 are thus produced as explained in conjunction with FIG. 1. Neighboring carrier units 2 of the carrier composite 20 are separated from one another by the depressions 28 in the separation regions S. In the singulation process leading to the modules 1, in particular in a sawing process, merely the cast body is 6 is cut-through. The metal element has previously been completely removed from a lower side by the etching process. A high surface exploitation of the carrier composite 20 can be achieved by the merely small width of the separation regions S.

In contrast to FIG. 5B, it is possible to achieve a module analogous to FIG. 4B, in which the lateral surfaces of the cast body 6 and the carrier unit 2 terminate flush with one another. This is possible by a commonly severing, e.g., sawing, the carrier composite together with the cast body. In the component shown as by FIG. 5B, in contrast, the cast body 6 projects from the carrier unit 2 in a lateral direction. The depressions 28 can be discernable on the severed carrier units 2.

Figure 6:
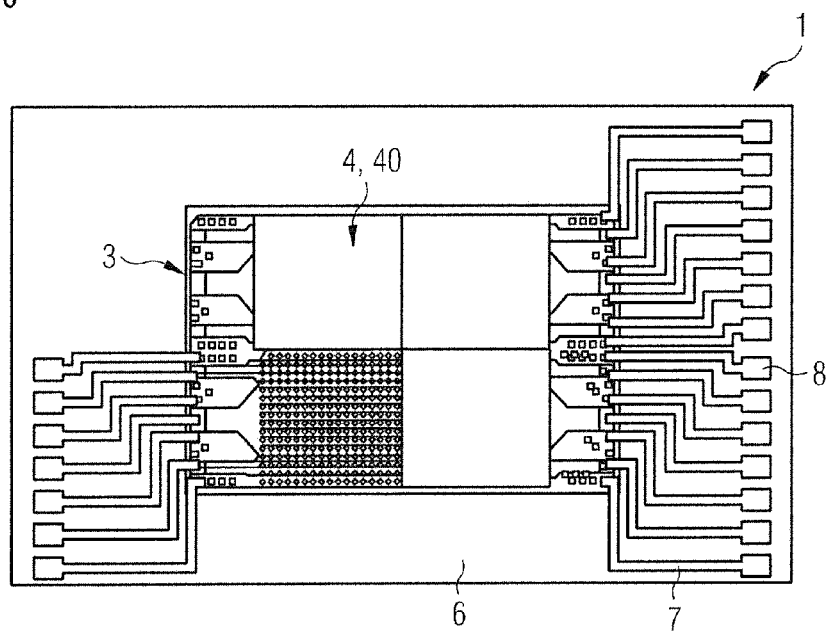
Figure 6:
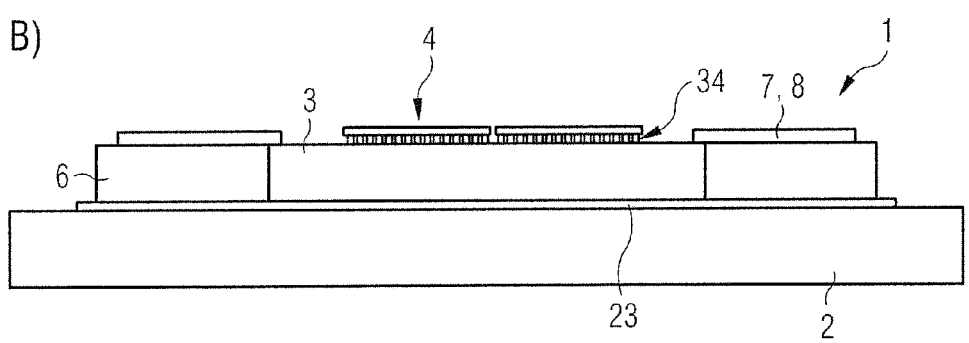

In the example of module 1 as illustrated in FIG. 6, the carrier unit 2 laterally projects from the cast body 6, as is also the case with the connecting element 23. This is achieved in that, when viewed in a top view, the cast body 6 is cast in a plurality of individual, isle-shaped regions around the respective logic chips 3 such that no cast body material needs to be removed subsequently.

However, the cast body 6 is preferably produced integrally over all carrier units 2 of the carrier composite 20. By the mechanically-stabilizing cast body 6, the carrier units can then be handled as a single unit even with the carrier composite already singulized. This may as well be the case in all other examples of the method.

Figure 7:
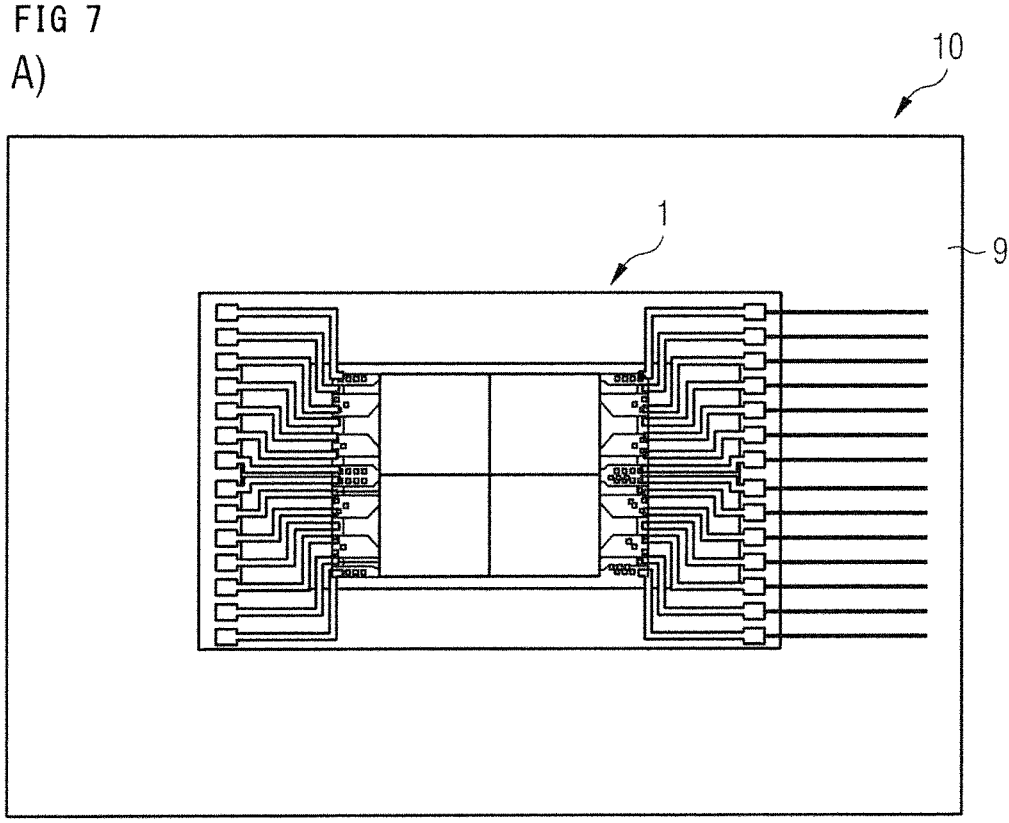
Figure 7:
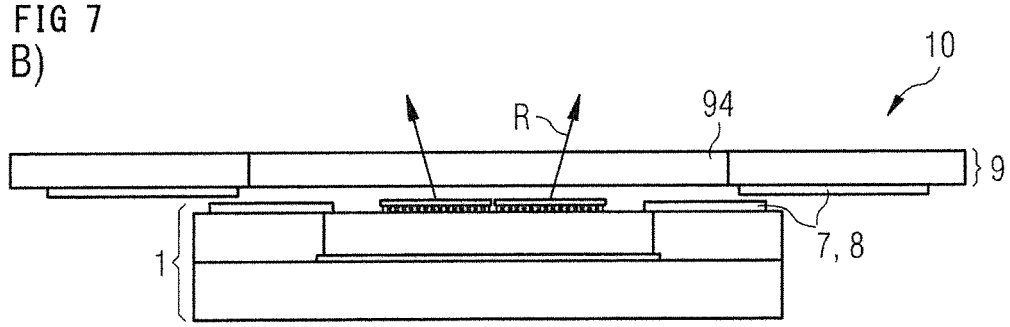

In the assembly 10 according to FIG. 7, the circuit board 9, which is, e.g., a printed circuit board, PCB for short, comprises a penetration 19. The penetration 19 reaches completely through the circuit board 9. The module 1, e.g., a module explained in conjunction with FIG. 4 or 5, is mounted to the circuit board 9 such that a radiation R can be emitted through the penetration 90 by the emitter regions. A connecting element between the contact points 8 on the circuit board 9 as well as on the module 1 is not shown.

Figure 8:
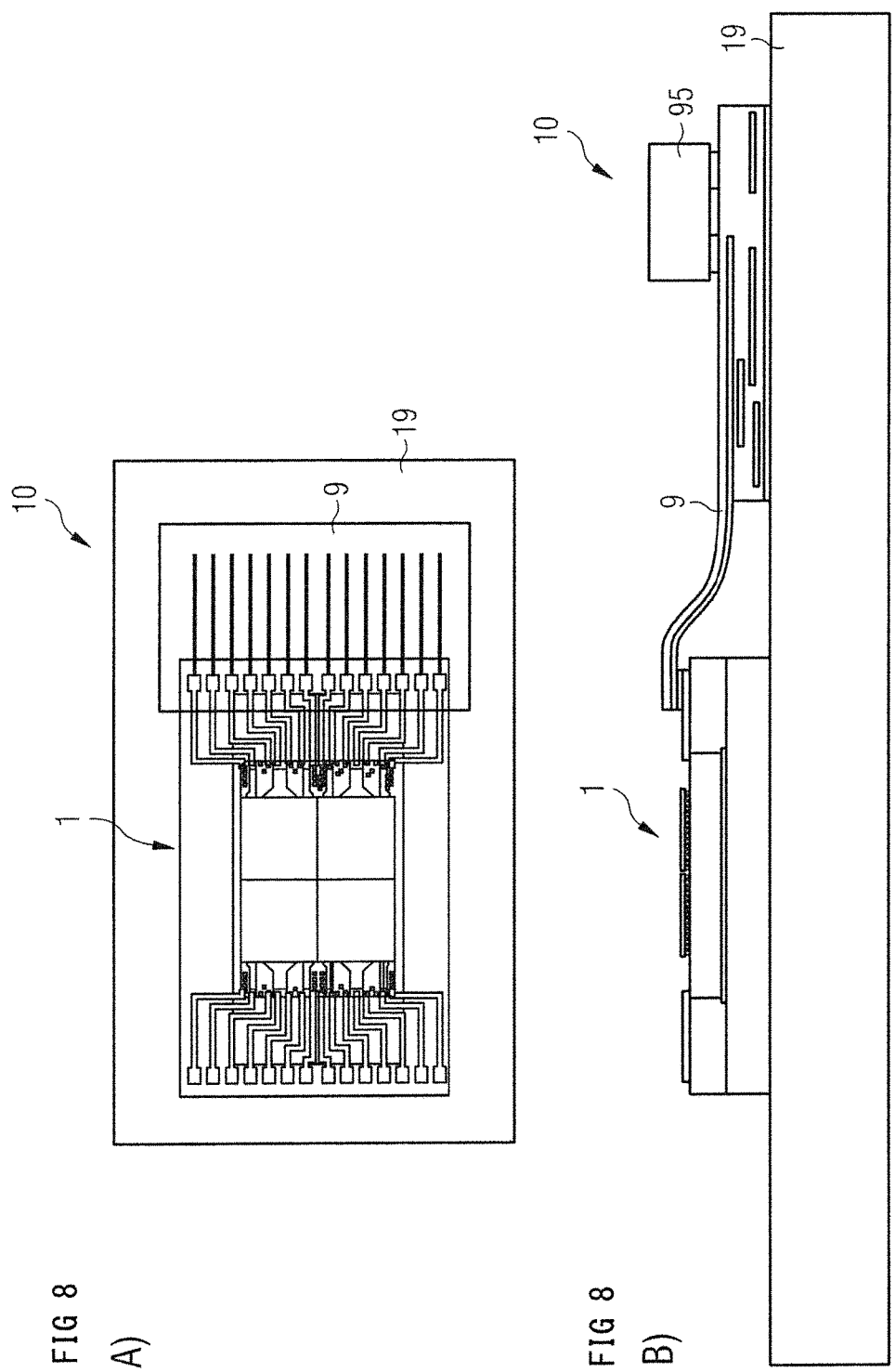

In the assembly 10, see top view in FIG. 8A and sectional view in FIG. 8B, the circuit board 9 is partially located laterally next to the module 1 in a top view. The circuit board 9 partially or completely is a flexible circuit board. In particular, the circuit board 9 is a so-called rigid-flex PCB, i.e., a circuit board comprising flexible as well as rigid regions. The module 1 as well as the circuit board 9 are applied to a common cooling body 19 formed of aluminum or copper or which is a metal core board.

Optionally, further electric components 95 are attached to the printed circuit board 9, preferably in surface mounted configuration. Controlling and addressing the module 1 is possible by such further components 95, for example. The circuit board 9 exclusively connects to an upper side of the module 1 facing away from the cooling body 19.

Such a cooling body 19 can also be present in all of the other examples, in particular also in the assembly 10, as shown in FIG. 7B. According to FIG. 7B, the cooling body 19 would then not necessarily be in direct connection with the circuit board 9.

The light-emitting diode chips 40 may be a so-called thin-film light-emitting diode chips as is the case for all other examples. Such thin-film diode chips are free from a growth substrate for a semiconductor layer sequence.

The method and assembly described herein are not limited by the description by the examples. This disclosure may rather comprise every new feature as well as any combination of features, which in particular includes every combination of features in the appended claims, even if the feature or combination is per se not explicitly indicated in the claims or examples.

This patent claims priority of DE 10 2014 117 897.1, the subject matter of which is incorporated herein by reference.

The invention claimed is:

1. A method of producing a plurality of optoelectronic modules comprising:
   A) providing a metal carrier composite having a plurality of carrier units,
   B) applying at least one logic chip each having at least one integrated circuit to the carrier units,
   C) attaching a plurality of light-emitting diode chips comprising in each case multiple emitter regions individually electrically-controllable, which are based on a semiconductor material and configured to generate radiation and can be controlled individually, to the logic chips attached to the carrier units,
   D) covering the emitter regions and the logic chips with a protective material so that upper sides of at least one of the emitter regions and the logic chips facing away from the carrier units are covered by the protective material,
   E) molding around the emitter regions and the logic chips so that a cast body is produced, which connects at least the carrier units and the logic chips with one another,
   F) removing the protective material and applying electrical conductor paths at least to the upper sides of the logic chips and to a cast body upper side of the cast body facing away from the carrier units, and
   G) severing the carrier assembly into the modules, wherein the carrier units as a whole or at least carrier isles on which the emitter regions and the logic chip are located do not have any electrical function in the finished module, and electrically controlling the emitter regions is effected exclusively via the logic chip of the respective module.

2. The method according to claim 1,
   wherein method steps A) to G) are performed in the indicated order,
   the carrier composite, at least in A) to F), is contiguous, integral and free of penetrations, and
   the carrier units each serve as a heat sink in the finished modules.

3. The method according to claim 1, wherein electric contact points for external electric connection of the module are exclusively produced on the cast body upper side.

4. The method according to claim 1, wherein G) comprises sub-steps:
   G1) patterning the carrier units from the lower sides of the carrier facing away from the logic chips by means of a material-removing method, and
   G2) subsequently, severing the cast body in separation regions between neighboring carrier units.

5. The method according to claim 4, wherein the separation regions are free of a material of the carrier composite and the carrier units.

6. The method according to claim 1, wherein in G), the carrier units are patterned such that in the finished module the emitter regions and the logic chips are each unambiguously attached to one of the carrier isles, and the carrier units each comprise a plurality of the carrier isles and the carrier isles are spaced from one another.

7. A method of producing a plurality of optoelectronic modules comprising:
   A) providing a metal carrier composite having a plurality of carrier units,
   B) applying at least one logic chip each having at least one integrated circuit to the carrier units,
   C) attaching a plurality of light-emitting diode chips comprising in each case multiple emitter regions individually electrically-controllable, which are based on a semiconductor material and configured to generate radiation and can be controlled individually, to the logic chips attached to the carrier units,
   D) covering the emitter regions and the logic chips with a protective material so that upper sides of the emitter regions and/or of the logic chips facing away from the carrier units are covered by the protective material,
   E) molding around the emitter regions and the logic chips so that a cast body is produced, which connects at least the carrier units and the logic chips with one another,
   F) removing the protective material and applying electrical conductor paths at least to the upper sides of the logic chips and a cast body upper side of the cast body facing away from the carrier units, and
   G) severing the carrier assembly into the modules, wherein the carrier units as a whole or at least carrier isles on which the emitter regions and the logic chip are located do not have any electrical function in the finished module, and electrically controlling the emitter regions is effected exclusively via the logic chip of the respective module,
      wherein electric contact points for external electric connection of the module are exclusively produced on the cast body upper side,
      in a direction away from the carrier units, the cast body upper side is produced to be terminating flush with the upper sides of the logic chips, and
      the emitter regions protrude from the cast body upper side in the direction away from the carrier units.

8. The method according to claim 1, wherein the carrier composite and the carrier units are etched from a first main side before E), and are etched from a second main side after F), wherein the carrier units are patterned by the two etching steps taken together.

9. The method according to claim 1,
wherein the emitter regions are exclusively attached to an upper side of the logic chip facing away from the assigned carrier unit, and
the upper side of the logic chip is provided with an electric contact structure so that at least one electric contact is present on the upper side per emitter region congruently to the emitter regions.

10. The method according to claim 1,
wherein all emitter regions of the respective finished module are part of only one light-emitting diode chip (40), and
the respective light-emitting diode chip forms a mechanical unit and is optically and electrically sub-divided into the emitter regions.

11. The method according to claim 1,
wherein, in a direction away from the carrier units, the cast body upper side is produced to be terminating flush with the upper sides of the logic chips, and
the emitter regions protrude from the cast body upper side in the direction away from the carrier units.

12. The method according to claim 1,
wherein the emitter regions each have an average lateral extension in the direction parallel to the cast body upper side between including 5 μm and 50 μm, between including 64 and $10^4$ of the emitter regions are provided per finished module, and
the emitter regions in operation of the module generate visible light including at least blue light.

13. An assembly comprising:
at least one optoelectronic module produced by the method according to claim 1, and
at least one circuit board directly connected to electric contact points of the module.

14. The assembly according to claim 13,
wherein the circuit board is attached to an upper side of the module facing away from the carrier unit, and
the circuit board comprises a penetration so that the emitter regions emit radiation through the penetration during operation.

15. The assembly according to claim 13, wherein the circuit board is a flexible circuit board.

16. The method according to claim 7,
wherein the carrier units as a whole or at least carrier isles on which the emitter regions and the logic chip are located, do not have any electrical function in the finished module, and
electrically controlling the emitter regions is effected exclusively via the logic chip of the respective module.

* * * * *